United States Patent [19]
Yamazaki et al.

[11] Patent Number: 5,183,511
[45] Date of Patent: Feb. 2, 1993

[54] PHOTO CVD APPARATUS WITH A GLOW DISCHARGE SYSTEM

[75] Inventors: Shunpei Yamazaki, Tokyo; Shigenori Hayashi, Atsugi; Takashi Inujima, Atsugi; Naoki Hirose, Atsugi, all of Japan

[73] Assignee: Semiconductor Energy Laboratory Co., Ltd., Kanagawa, Japan

[21] Appl. No.: 352,644

[22] Filed: May 12, 1989

Related U.S. Application Data
[63] Continuation of Ser. No. 76,399, Jul. 22, 1987, abandoned.

Foreign Application Priority Data
[30]
Jul. 23, 1986 [JP] Japan ................................ 61-174275
Sep. 24, 1986 [JP] Japan ................................ 61-226447

[51] Int. Cl.⁵ .............................................. C23C 16/48
[52] U.S. Cl. .................................... 118/723; 118/715; 118/722
[58] Field of Search .................. 118/722, 723, 50.1, 118/715; 427/54.1; 313/607; 315/DIG. 7

[56] References Cited
U.S. PATENT DOCUMENTS
4,664,938 5/1987 Walker ........................... 118/723 X
4,857,139 8/1989 Tashiro et al. ................. 427/54.1 X
4,910,044 3/1990 Yamazaki et al. ................. 427/54.1

FOREIGN PATENT DOCUMENTS
561232 6/1977 U.S.S.R. ............................. 313/607

Primary Examiner—Evan Lawrence
Attorney, Agent, or Firm—Sixbey, Friedman, Leedom & Ferguson

[57] ABSTRACT

A photo CVD apparatus includes a reaction chamber, a light source for radiating light to the inside of the chamber through a light window, and a pair of electrodes disposed in the chamber for glow discharge, one of the electrodes being located on the light window. After deposition by photo CVD, a light window for transmission of UV light is cleaned by plasma etching by virtue of glow discharge taking place between the electrodes. The light source and the electrodes for plasma etching share one power supply for supplying high frequency electric power.

12 Claims, 7 Drawing Sheets

PHOTO CVD APPARATUS WITH A GLOW DISCHARGE SYSTEM

This application is a continuation of Ser. No. 07/076,399, filed Jul. 22, 1987, now abandoned.

BACKGROUND OF THE INVENTION

This invention relates to a photo enhanced CVD apparatus for depositing a ceramic coat or the like on a substrate.

For photo enhanced CVD, high pressure mercury lamps, and low pressure mercury lamps are used. The low pressure mercury lamp comprises a bulb for light emitting which is filled with argon gas at several Torr as a initiator besides mercury gas. The bulb is provide with a pair of inside electrodes which are connected with external contacts for inputting electric power. By virtue of high voltage applied to the electrodes, e.g., a commercial electricity supply, discharge takes place and mercury atoms are excited to the high energy levels, $6^3O_0$, $6^3P_1$, $6^3P_2$, and $6^1P_1$, as shown in FIG. 1. Out of the energy level transitions to the ground level of electron of the excited atoms, the transition from $6^3P_1$ is most likely in virtue of the collision with argon atoms, and therefore light with 254 nm in wavelength is emitted accompanying this transition. The spectral distribution of such a conventional mercury lamp is shown in FIG. 2. As seen from the diagram, the emission intensity is most strong at 254 nm in wavelength and the next is at near 185 nm.

On the other hand, in the current developing manufacturing method for forming a semiconductor film by photo enhanced CVD, an illumination of short wavelength, particularly of 185 nm, is effective for decomposing silane gas ($Si_nH_{2n+2}$, where n is an integer). So it has been demanded to obtain ultraviolet light intensified at a wavelength near 185 nm.

Further, because ultraviolet light is radiated through a light window from a mercury lamp in a prior art CVD apparatus, the deposition simultaneously takes place on the surface of the window as the radiation passes therethrough during deposition on a substrate, and eventually the optical reaction terminates when the product deposited on the window forms an opaque layer so thick that the ultraviolet light passing through the window is too diminished to excite the reaction. For this reason, there is a limitation to the thickness of a layer obtained by the deposition, and it is impossible to deposit an overlying layer continuously after the deposition of an underlying layer.

SUMMARY OF THE INVENTION

It is therefore an object of the invention to provide a CVD apparatus for depositing a layer on a substrate at a high speed.

It is another object of the invention to provide a CVD apparatus which requires a small amount of space for installation.

It is a further object of the invention to provide a low cost photo CVD apparatus.

DETAILED DESCRIPTION OF THE PREFERRED EMBODIMENTS

Figure 1:
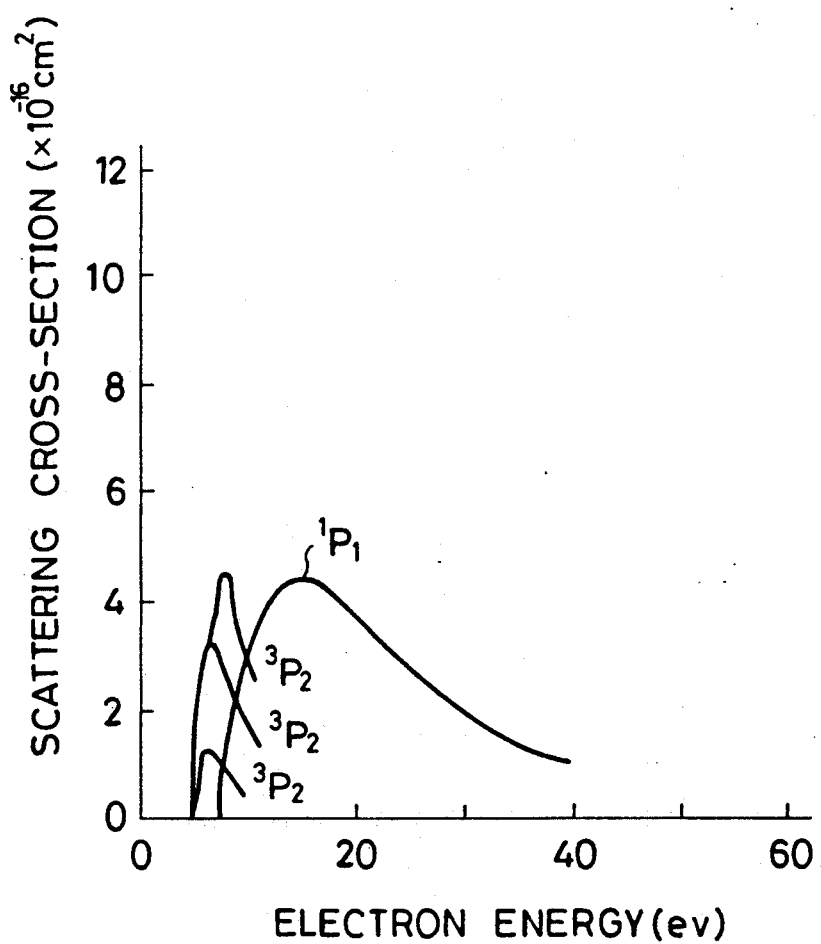
FIG. 1 is a graphical diagram showing energy levels of the electron of a mercury atom.
Figure 2:
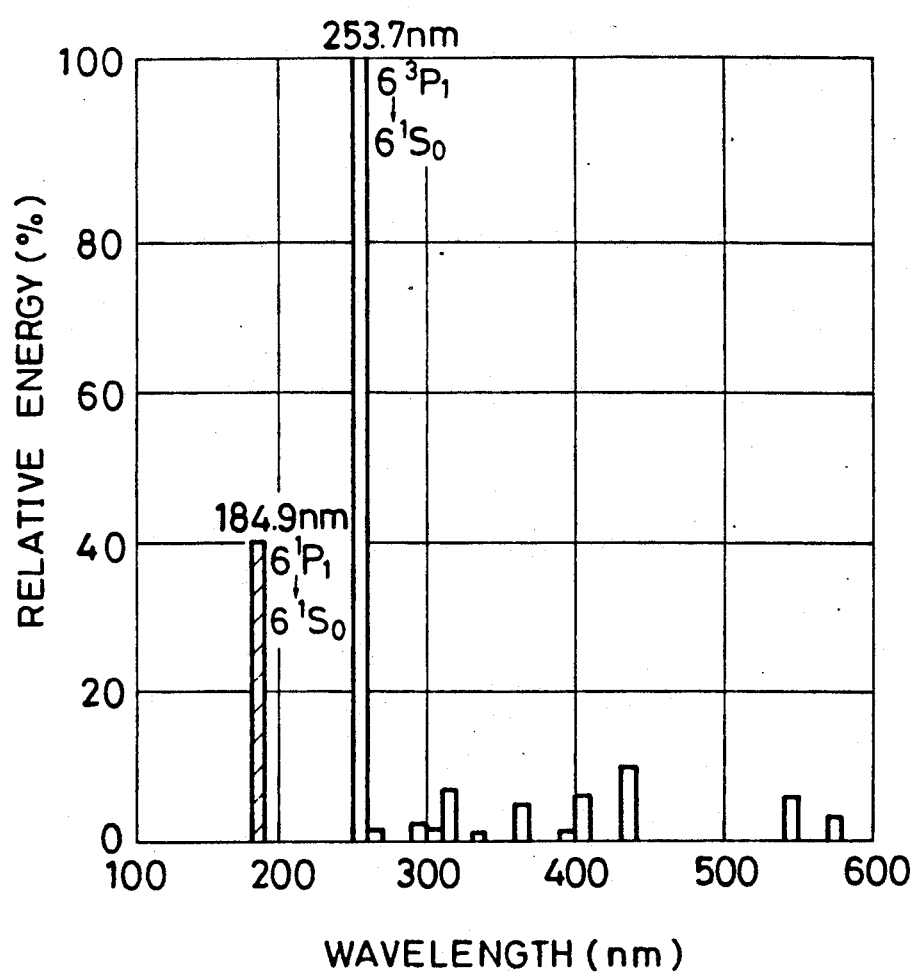
FIG. 2 is a graphical diagram showing the spectral characteristics of light emission of a conventional mercury lamp.
Figure 3:
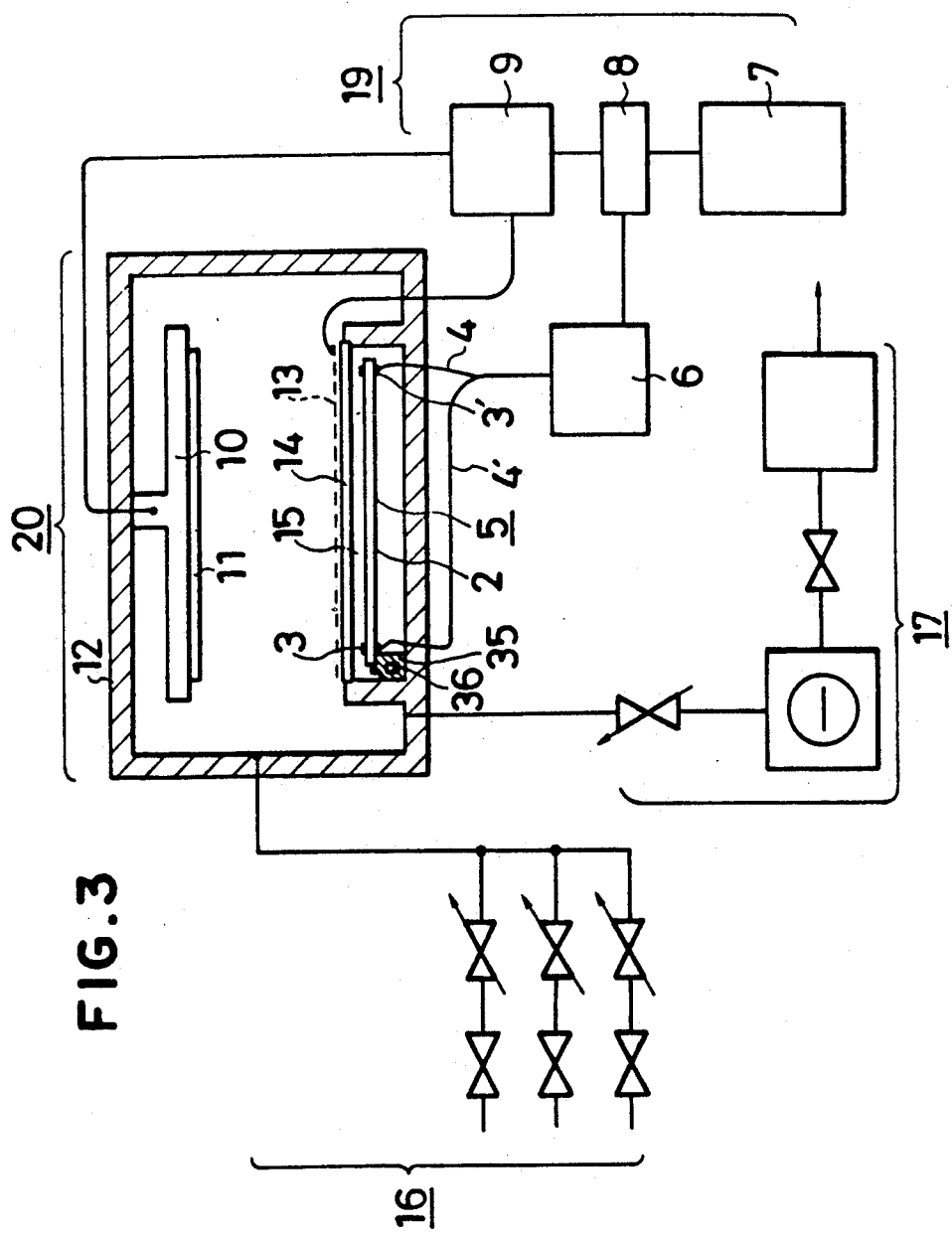
FIG. 3 is block diagram showing a photo CVD apparatus in accordance with the invention.

Referring now to FIG. 3, a CVD apparatus in accordance with the invention is illustrated. In the figure, the apparatus comprises a reaction chamber 12, a process gas introducing system 16, an exhausting system 17, a holder 10 for holding a substrate 11, a mercury lamp 2 provided in a light source chamber 15 and a power supplying system 19. The light source chamber is provided with a light window 14 on which a meshed electrode 13 is placed. The holder 10 functions also as the other electrode together with the substrate 11 to produce discharge between them and the meshed electrode 13.

Reactive gas is inputted from the system 16 at a negative pressure, if necessary, together with a dopant gas. The reactive gas is exposed to the illumination of light emitted from the mercury lamp 2 through the light window 14 made of artificial quartz, and undergoes a photochemical reaction, whereupon the product of the reaction is deposited on the surface of the substrate 11. A power supply 7 can be shared by the electrodes 10 and 13 for glow discharge and the mercury lamp 2 through matching transformers 6 and 9 by means of a switch 8. After completion of deposition, exhausted gas can be removed from the chamber 12 by the exhausting system 17. The light source chamber 15 may be filled with nitrogen, hydrogen or an inert gas, or may be in vacuum condition. The matching transformer 6 is provided for stabilizing the discharge in the mercury lamp 2 in spite of the load resistance component of the mercury lamp.

The electric power supplied by the power supply 7 includes high frequency component to enhance the intensity of light having 185 nm in wavelength and to be utilized also for plasma discharge in the reaction chamber 12. The frequency of the electric power is chosen higher than 10 KHz, e.g., 50 KHZ or 13.56 MHz. With this high electric power, the transition probability to the exciting level of $6^1P_1$ becomes high and thereby the intensity of light near 185 nm in wavelength is made high. For this reason, the light source chamber is filled only with mercury lamp 2.

If argon gas exists in the mercury lamp 2, it helps by collision with mercury atoms, the transition of electrons from the $6^3P_1$ level and the supplied energy is mainly consumed by emission of light at 245 nm in wavelength. On the other hand, if argon gas substantially does not exist in the mercury lamp, the lifetime of excited mercury atom of the $6^3P_1$ level becomes long so that the proportion of the supplied energy shared for the transition to the level of $6P^1P_1$ is made high. Eventually the deposition speed become greater by the increment of the transition to the level of $6^1P_1$.

Figure 4:
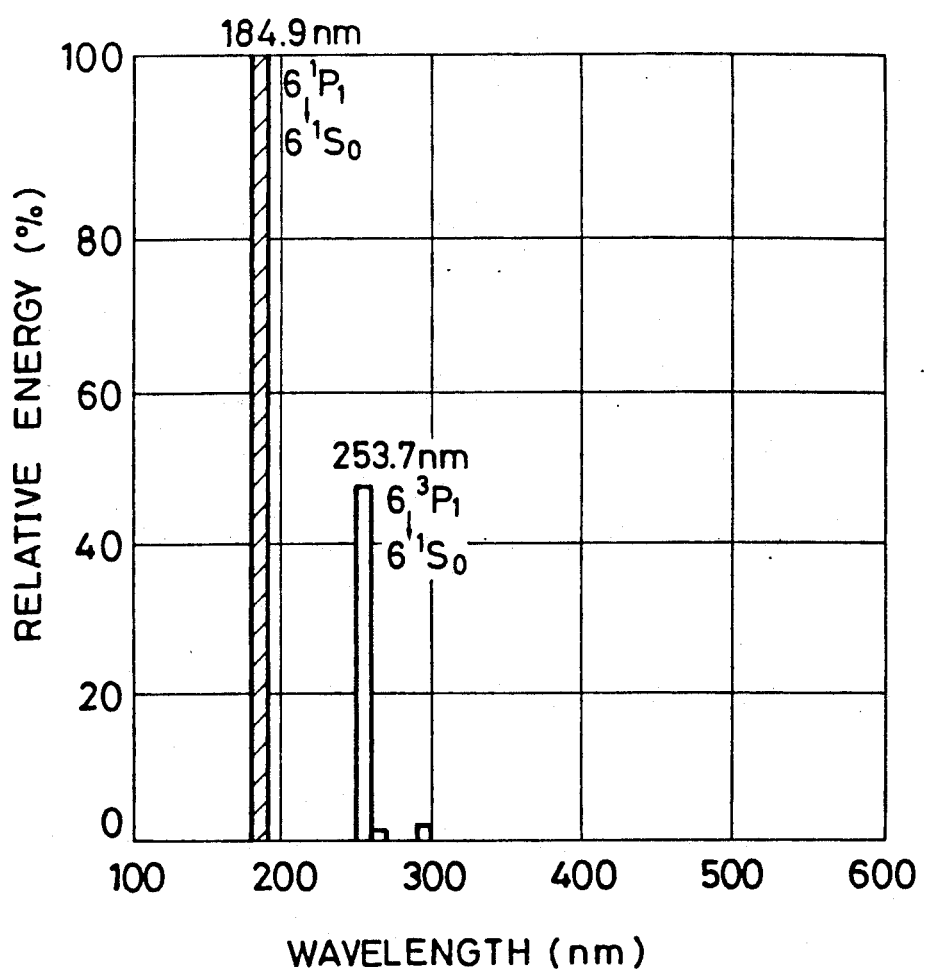
FIG. 4 is a graphical diagram showing the spectral characteristics of a mercury lamp in accordance with the invention.

However, because of the low vapor pressure of mercury, $10^{-2}$ to $10^{-3}$ Torr at 25° to 50° C. and the absence of argon atoms, the discharge is not easy to take place and is very unstable. For this reason, as an electric power, high frequency power is used, according to the invention. The pressure in the mercury lamp is controlled by adjusting the temperature of liquid mercury accumulated in a reservoir 36 into which mercury is condensed and from which mercury is entered into the mercury lamp as vapor. The temperature control is made by an electronic heater 35 in which the reservoir 36 is held so that light emission can take place preferentially at 185 nm in wavelength as shown in FIG. 4.

Figure 5A:
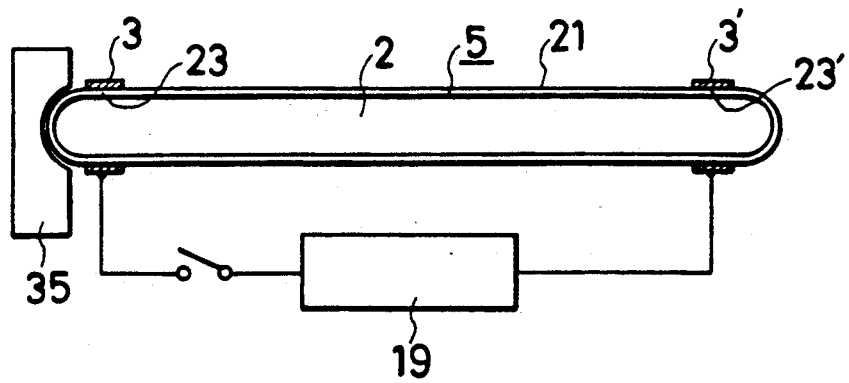
FIGS. 5(A), 5(B) and 5(C) are cross sectional views showing mercury lamps in accordance with the invention.

FIG. 5(A) is a schematic view showing an example of mercury lamp in accordance with the invention. The low pressure mercury lamp 5 is comprised of a bulb 21, and a pair of electrodes 3 and 3'. The bulb is filled with mercury gas and not with argon gas. The heater is in contact with one end of the mercury lamp. According to this structure, the bulb is a completely closed quartz tube and no lead wire across the wall of the tube for connection with the inside is provided so that it is unlikely to cause cracks due to the difference between a metal (of the wire) and a quartz (of the tube) in thermal expansion. When a plurality of mercury lamps are employed, a choke coil connected in series for each mercury lamp can be dispensed with by adjusting the resistance of the quartz tube.

Figure 5B:
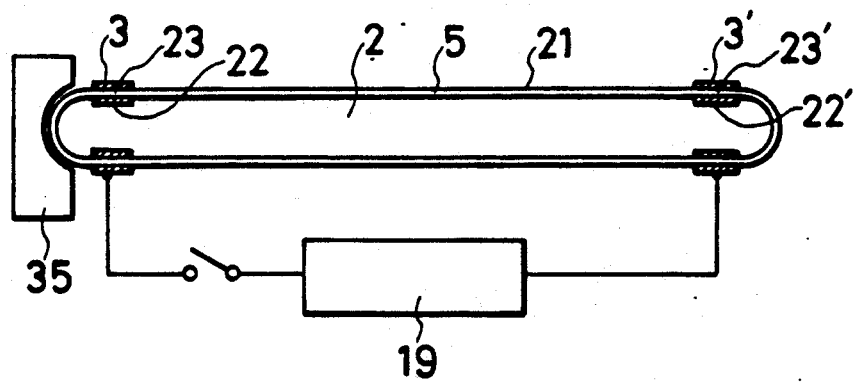

FIG. 5(B) is another example which is provided with a pair of inner electrodes 22 and 22' to prevent ions from directly colliding with the inner surface of quartz bulb 5. The inner electrodes are located just opposite to the outer electrodes 3 and 3' with the quartz wall therebetween to obtain a certain (stable) resistance by capacitor constituted inbetween.

Figure 5C:
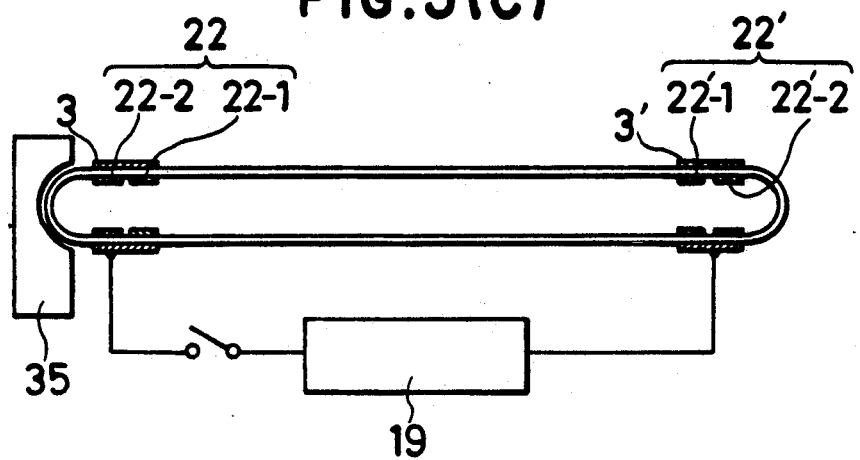

FIG. 5(C) shows modification of the example in FIG. 5(B). In this modification, the inner electrodes 22 and 22' are separated into two portions respectively. The first electrodes 22-1 and 22'-1 are made of a material which has a resistance to a high temperature and a large work function, e.g., platinum, tungsten, molybdenum or a compound thereof, for receiving ions incident thereon. The second electrodes 22-2 and 22'-2 located near the end of the mercury lamp are made from a material which has a low work function to facilitate the emission therefrom, e.g., a metallic electrode coated with magnesium, nickel, barium oxide or so forth. Generally speaking, such a material having a low work function is liable to be damaged by ion collision. On the other hand, while a metal having a high work function is stable to the collision of ions, the discharge starting voltage thereof is very high. It is for this reason that the electrodes 22 and 22' are made from two materials. The separation of the outer electrodes and the inner electrodes makes the manufacturing of same very easy.

Figure 6:
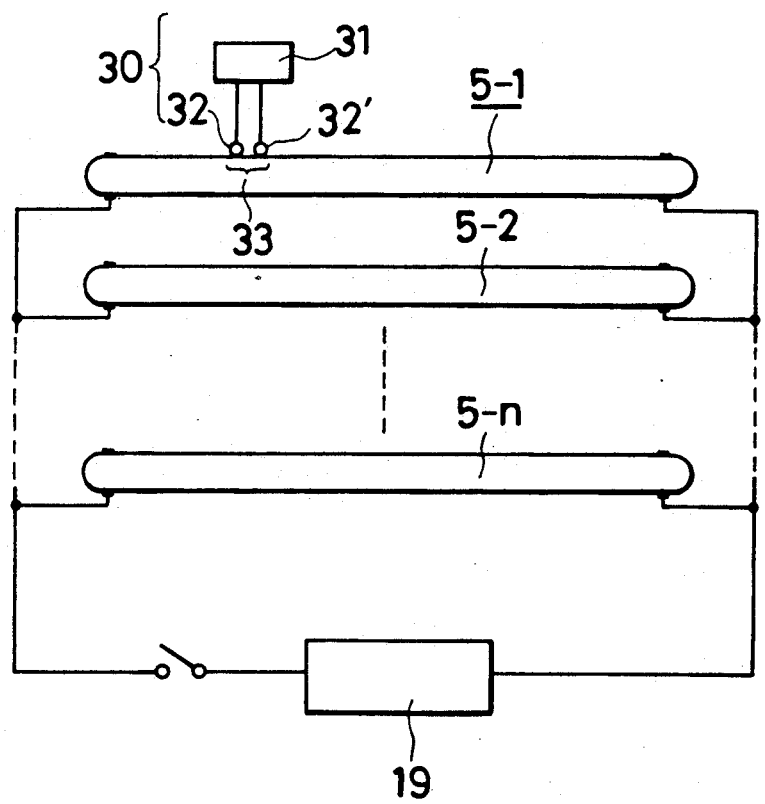
FIG. 6 is a block diagram for explaining lightening of a plurality of mercury lamp.

FIG. 6 is a schematic diagram showing a plurality of mercury lamps 5-1, 5-2, ..., 5-n which are connected in parallel with an electric power supply 19. In each mercury lamp glow discharge takes place between a pair of electrodes provided at the opposed ends. It is very effective for changing the discharge from a glow discharge to an arc discharge in each mercury lamp to apply a high driving pulsed voltage to each lamp for instance. For example, a 25 KV voltage is applied to a mercury lamp by touching the outer surface of the mercury lamp with electrodes 32 and 32'. By this high voltage, arc discharge takes place in local area. This discharge does not disappear even after removing the electrodes 32 and 32' from the mercury lamp 5-1 but prevails over the inside of the bulb. Thereafter, such a discharge is caused in other lamps by applying in turns high voltage in the same manner. In this regard, the resistance of the portion of quartz bulb just below the electrodes 3 and 22 has to be adjusted optimally.

Figure 7:
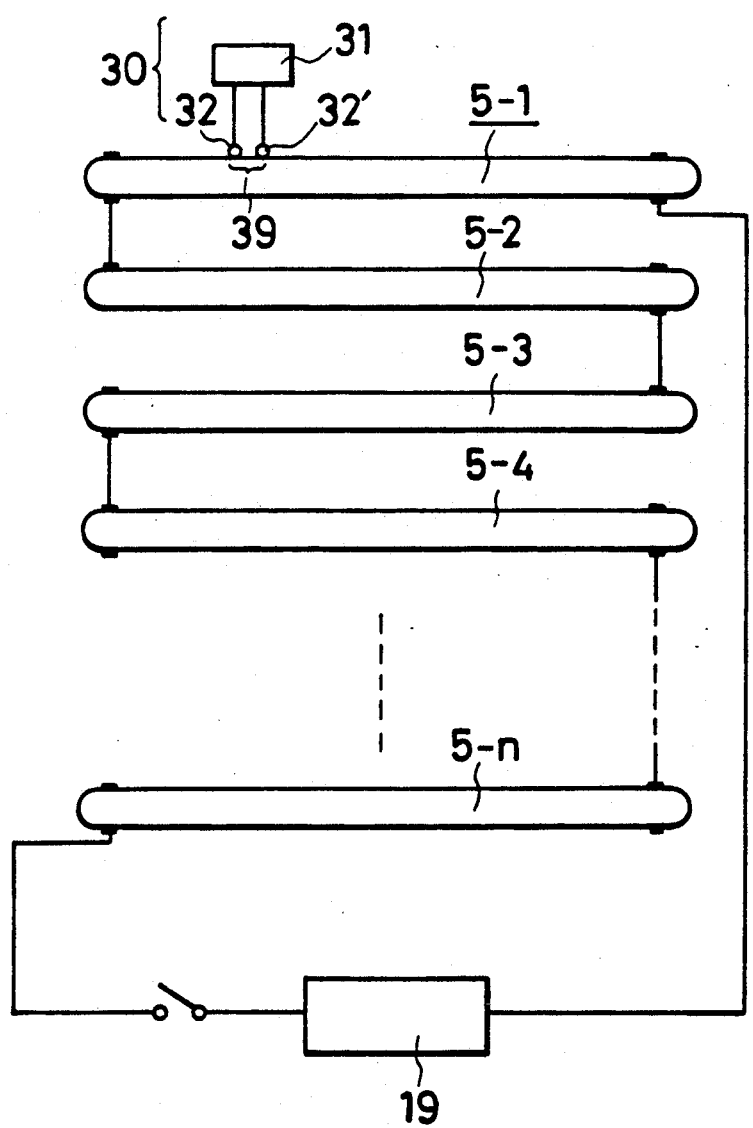
FIG. 7 is a block diagram showing a plurality of mercury lamps connected in series.

FIG. 7 is a schematic diagram showing a plurality of mercury lamps 5-1, 5-2, ..., 5-n which are connected in series with the electric power supply 19. The mercury lamps are illuminated in the same manner as explained in conjunction with FIG. 6.

EXAMPLE:

Silane gas ($Si_nH_{2n+2}$, where n is an integer) was introduduced to the reaction chamber 12 and decomposed by virtue of ultraviolet light emitted from the mercury lamp 5 through the window 14, and an amorphous silicon film was deposited on the surface of a substrate heated by a heater 10 functioning also as the holder 10. Prior to the next process, the product unintentionally deposited on the window 14 was removed by plasma etching by turning over the switch 8 to supply electric power to the electrodes 10 and 13 after exhausting the reactive gas and introducing an etchant gas into the reaction chamber. After the etching the inside of the reaction chamber was exhausted by the exhausting system 17, another substrate was introduced into the reaction chamber 12 to deposit a film on the substrate in the same manner.

The frequency of the electric power was 13.56 MHz, but in accordance with the example, the illumination of the mercury lamps 5 was proved possible in the frequency range between 1 KHz and 2.54 GHz.

While the invention was described in conjunction with the preferred embodiment, it should not be limited to this particular embodiment but only limited to the appended claims. It should be understood that many modifications and variation will occur to skilled persons in the art as described below. In place of electrodes 3 and 3', a coil (solenoid) can be wound around the bulb of mercury lamp 2. A loading chamber may be provided adjacent to the reaction chamber to decrease the process time. UV cleaning can be carried out in combination with the above embodiment. Further, the invention can be applied for photo plasma CVD in which photo energy and ECR (Electron Cyclotron Resonance) energy can be utilized. Yet, although the mercury lamp is described as straight tubular shaped, it can be annular-shaped, spiral-shaped, comb-shaped, or so forth.

What is claimed is:

1. A photo enhanced CVD apparatus comprising:
    a reaction chamber;
    a vacuum pump for evacuating said reaction chamber;
    a reactive gas introducing system for inputting a reactive gas into said reaction chamber;
    a holder for holding a substrate in said reaction chamber;
    a light source provided for radiating light to the inside of said reaction chamber through a light window;
    a pair of electrodes disposed in said reaction chamber wherein one of said electrodes is a conductive mesh disposed on said light window; and
    a power supply for supplying electric power both to said light source and to said electrodes.

2. Apparatus as in claim 1 where said electric power is a high frequency electric power.

3. A chemical vapor reaction apparatus comprising:
a reaction chamber;
a vacuum pump for evacuating said reaction chamber;
a holder for holding a substrate in said reaction chamber;
a gas supplying means for introducing a process gas into said reaction chamber;
a light source including a gas discharge tube for emitting light to an inside of said reaction chamber through a light window;
at last one electrode provided in said reaction chamber on a surface of said light window for performing a plasma cleaning; and
a common power source for supplying power to said light source and to said at least one electrode whereby a photo enhanced chemical vapor reaction and plasma cleaning occurs in said reaction chamber.

4. The apparatus of claim 3 further comprising means for transmitting electric power from said power source selectively to said light source or said at least one electrode.

5. The apparatus of claim 3 wherein said power is a high frequency power.

6. The apparatus of claim 5 wherein said discharge tube is filled substantially only with a mercury gas.

7. The apparatus of claim 5 wherein the frequency of said power source is higher than 10 kHz.

8. The apparatus of claim 5 wherein said discharge tube is energized through an electrode located on an outside of said tube.

9. The apparatus of claim 3 wherein said discharge tube is housed in a light source chamber which includes said light window.

10. The apparatus of claim 3 wherein said substrate holder functions as an opposed electrode to said electrode provided on said light window.

11. The apparatus of claim 3 wherein said electrode provided on said light window is a conductive mesh.

12. The apparatus of claim 3 further comprising matching transformers through which electric power is supplied from said power source selectively to said light source or said electrode.

* * * * *